United States Patent [19]

Sun et al.

[11] Patent Number: 5,262,353

[45] Date of Patent: Nov. 16, 1993

[54] PROCESS FOR FORMING A STRUCTURE WHICH ELECTRICALLY SHIELDS CONDUCTORS

[75] Inventors: Shih-Wei Sun; Yasunobu Kosa; John R. Yeargain, all of Austin, Tex.

[73] Assignee: Motorola, Inc., Schaumburg, Ill.

[21] Appl. No.: 829,837

[22] Filed: Feb. 3, 1992

[51] Int. Cl.$^5$ .................... H01L 21/44; H01L 21/48
[52] U.S. Cl. ........................ 437/195; 437/61;
257/503; 257/508; 257/759
[58] Field of Search ............... 437/195, 61; 257/758, 257/759, 760, 503, 508

[56] References Cited

U.S. PATENT DOCUMENTS

| | | | |
|---|---|---|---|
| 5,100,818 | 3/1992 | Arima et al. | 437/50 |
| 5,110,762 | 5/1992 | Nakahara et al. | 257/758 |
| 5,164,334 | 11/1992 | Mizushima | 437/195 |

*Primary Examiner*—Olik Chaudhuri
*Assistant Examiner*—Long Pham
*Attorney, Agent, or Firm*—Keith E. Witek

[57] ABSTRACT

A shielding structure (10) and method of formation. The shielding structure (10) has a substrate (12). A first dielectric layer (14) overlies the substrate (12). A conductive layer (16) is formed overlying the dielectric layer (14), is patterned, and is etched to form electrically isolated conductive regions from conductive layer (16). The electrically isolated conductive regions have sidewalls and the etching of conductive layer (16) exposes portions of dielectric layer (14). The exposed portions of dielectric layer (14) are etched to form trenched portions of dielectric layer (14). A second dielectric layer (18) is formed overlying the electrically isolated conductive regions, including the sidewalls, and overlying the trenched portions to create recessed regions that separate the electrically isolated conductive regions. A shielding conductive layer (20) is formed overlying dielectric layer (18) and at least partially fills the recessed regions to shield the electrically isolated conductive regions from each another.

13 Claims, 4 Drawing Sheets

PROCESS FOR FORMING A STRUCTURE WHICH ELECTRICALLY SHIELDS CONDUCTORS

FIELD OF THE INVENTION

The present invention relates generally to semiconductor technology, and more particularly, to the electrical shielding of conductors.

BACKGROUND OF THE INVENTION

As integrated circuit (IC) technology advances, integrated circuit minimum feature geometries and surface cell sizes become smaller. In addition, as conductive region separation becomes smaller over time, capacitive coupling increases between conductive regions. Capacitive coupling is phenomenon wherein undesirable capacitance results between adjacent conductors in an IC circuit. Capacitive coupling usually causes a phenomenon known as cross-talk and induces large conductive region RC (resistive-capacitive) time delays in IC conductors. In order to reduce the effects described above, several isolation methods were either implemented or researched.

One method used to reduce the capacitive coupling, and therefore cross-talk and RC time delays, is to insulate conductive lines and regions with a low permittivity dielectric. An example of a known low permittivity dielectric is boro-nitride. Instead of using dielectrics such as nitride, silicon dioxide ($SiO_2$), tetra-ethyl-orthosilicate (TEOS) based oxides, boro-phosphate-silicate-glass (BPSG), or phosphate-silicate-glass (PSG) which have a dielectric permittivity constant on the order of three to four, dielectrics with a permittivity less than three are used. It is known that isolation via low permittivity constant dielectrics reduces capacitance coupling between adjacent conductors. One disadvantage is that this method of capacitive coupling reduction is only able to reduce the capacitive coupling by a maximum factor of three. Greater reduction in the capacitive coupling is required for many applications, and the use of low permittivity dielectrics requires extensive and expensive research of new materials, processes, and/or equipment.

Another method used to reduce capacitive coupling is to replace conventional conductive lines and/or regions with super-conductive lines and/or regions. Although super-conductive interconnects will reduce capacitive coupling effects, super-conductors are expensive to research and can only operate at low temperatures. Therefore, the use of super-conductors in an integrated circuit product may limit product applications or increase maintenance costs and/or operational costs. In addition, super-conductors tend to be difficult to work with chemically and mechanically, unlike other conductive materials such as aluminum, polysilicon, or copper. Super-conductors are not easily compatible with current integrated circuit processing.

Another way to isolate conductive regions is to use an air bridge or coaxial cable approach. A conductive region which has an underlying dielectric layer is over-etched, usually in an isotropic manner, to remove portions of the dielectric layer and leave the conductive layer suspended in the air. The conductive region is then insulated with a shielding dielectric, and the shielding dielectric is covered with a shielding conductive region. The shielding dielectric and the shielding conductive region completely surround the conductive region. This completed structure is very similar to a known shielded coaxial cable structure which is used for long distance signal transmission. All known processes that are used to make a coaxial semiconductor device, are extremely complex, are unproven for most integrated circuit technology, and may result in low circuit yield when used for high-volume production.

SUMMARY OF THE INVENTION

The previously mentioned disadvantages are overcome and other advantages achieved with the present invention. In one form, the present invention comprises a structure for shielding and a method for forming the structure for shielding. A substrate is provided and a first dielectric layer is formed overlying the substrate. A first conductive layer of material is formed overlying the first dielectric layer. Portions of the first conductive layer are removed to form electrically isolated conductive regions having sidewalls. The removal of the portions of the first conductive layer forms exposed regions of the first dielectric layer. The exposed regions of the first dielectric layer are removed to form trenched portions of the first dielectric layer. A second dielectric layer is formed conformally overlying the electrically isolated conductive regions, the sidewalls of the electrically isolated conductive regions, and the trenched portions of the first dielectric layer. The formation of the second dielectric forms recessed regions that separate the electrically isolated conductive regions. A shielding conductive layer is formed overlying the second dielectric layer including within the recessed regions.

The present invention will be more clearly understood from the detailed description below in conjunction with the accompanying drawings.

DESCRIPTION OF THE PREFERRED EMBODIMENT

Figure 1:
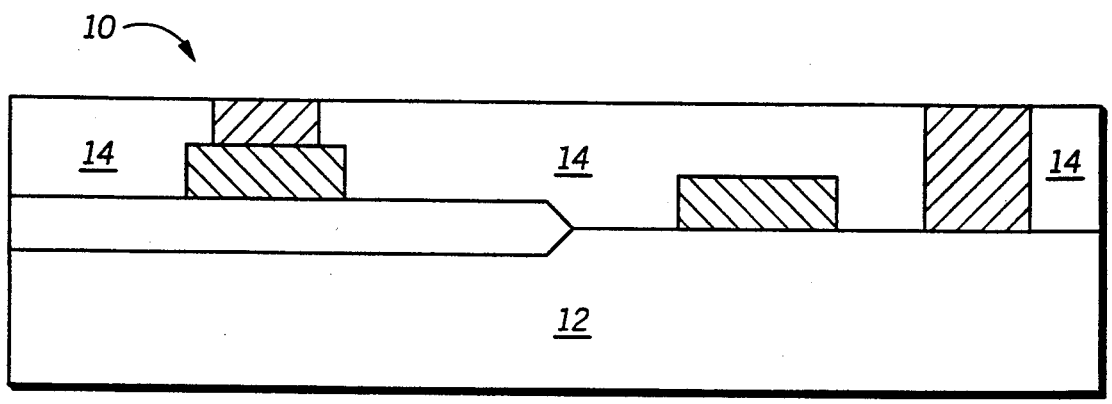
FIGS. 1-7 illustrate, in cross-sectional form, a method for forming a structure for shielding in accordance with the present invention.

Illustrated in FIGS. 1-7 is a process for forming a structure for shielding. FIG. 1 illustrates a structure which is suitable for formation of a shielding structure 10. Structure 10 has a substrate 12. Substrate 12 may be made of silicon, gallium arsenide, silicon on sapphire, epitaxial formations, germanium, germanium silicon, and/or like substrate materials. Preferably, the substrate 12 is made of silicon. A first dielectric layer 14 is formed overlying the substrate 12. It is important to note that the dielectric layer 14 can be several layers above the substrate 12 or can be in direct contact with the substrate 12. In a preferred form, dielectric layer 14 overlies several device layers, wherein device layers are layers such as diffusions, dielectric layers, polysilicon regions, conductive formations, contacts, transistor formations, substrate material and the like.

FIG. 1 has several unmarked layers or device layers which are not specifically labeled. The unmarked layers lie adjacent or under dielectric layer 14 and illustrate the fact that dielectric layer 14 can be physically removed or in contact with the substrate 12. The unmarked layers are not labeled due to the fact that the unmarked layers are not required in order to understand the invention disclosed herein. Dielectric layer 14 may be made of nitride, tetra-ethyl-ortho-silicate (TEOS) based oxides, boro-phosphate-silicate-glass (BPSG), phosphate-silicate-glass (PSG), oxide-nitride-oxide (ONO), silicon dioxide ($SiO_2$), or a similar dielectric material. Preferably, dielectric layer 14 is a BPSG oxide. In some cases, planarizing dielectric layer 14 has advantages in terms of reducing possibilities for subsequent etch-related short circuiting and reducing subsequent topographical problems. It is important to note that etch-back or like planarization is not usually preferred or required, but reflow of BPSG is usually performed.

Figure 2:
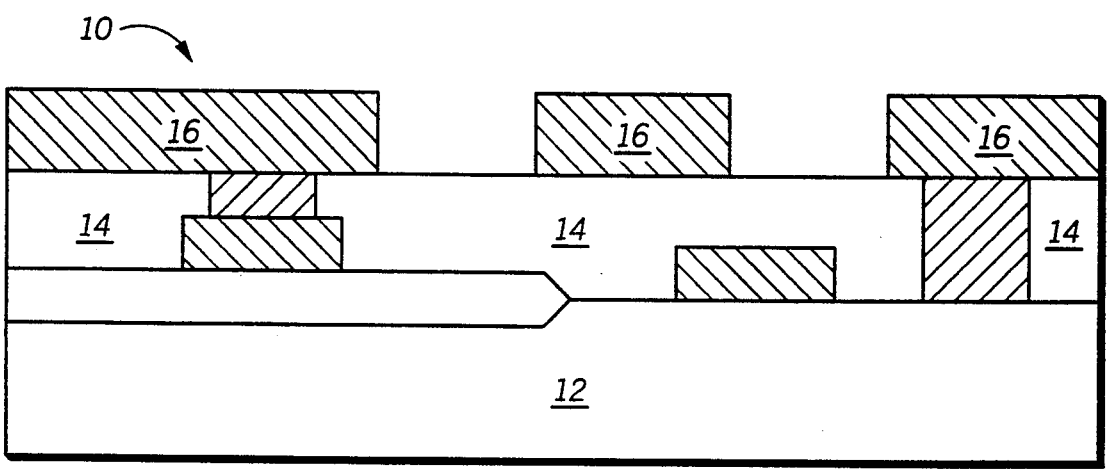

In FIG. 2, a first conductive layer 16 is formed overlying the dielectric layer 14. Conductive layer 16 is made of either a metal material, such as aluminum, copper, tungsten, gold, or like metal materials, salicides, silicides, polysilicon, epitaxial formations, a substrate material, or similar conductive or semiconductive formations. Conductive layer 16 may also be formed from combinations of the conductive materials discussed herein. Portions of conductive layer 16 are patterned and etched via known photolithographic and etch processing to form electrically isolated conductive regions of conductive layer 16. Each of the electrically isolated conductive regions has sidewalls. The removal of portions of conductive layer 16 also forms exposed regions of dielectric layer 14 that lie between the electrically isolated conductive regions of conductive layer 16.

Figure 3:
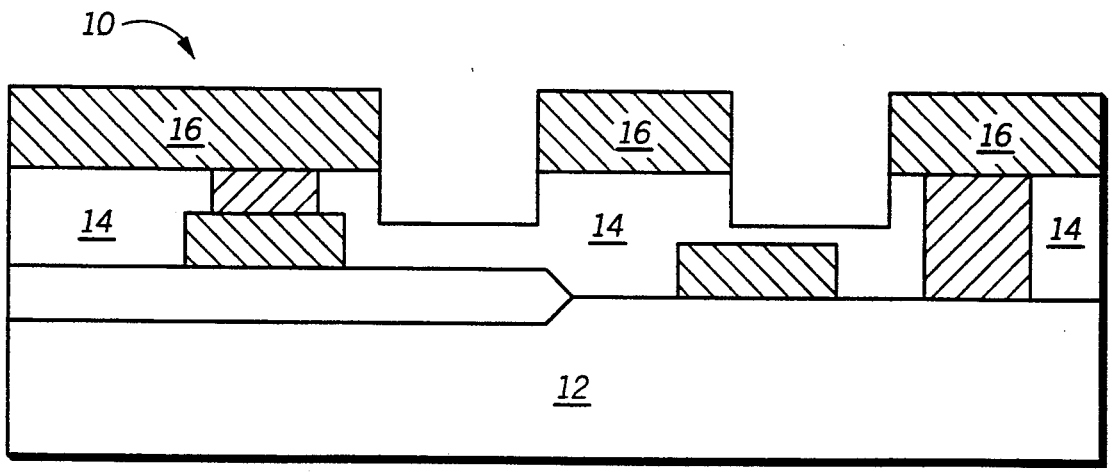

In FIG. 3, the exposed regions of dielectric layer 14 are etched to form trenched portions, also referred to as trenches, of the first dielectric layer 14. The etch illustrated in FIG. 3 is anisotropic. Anisotropic etching produces sidewalls that are substantially vertical, and isotropic etching can produce a predetermined sidewall angle that is process controlled.

Figure 4:
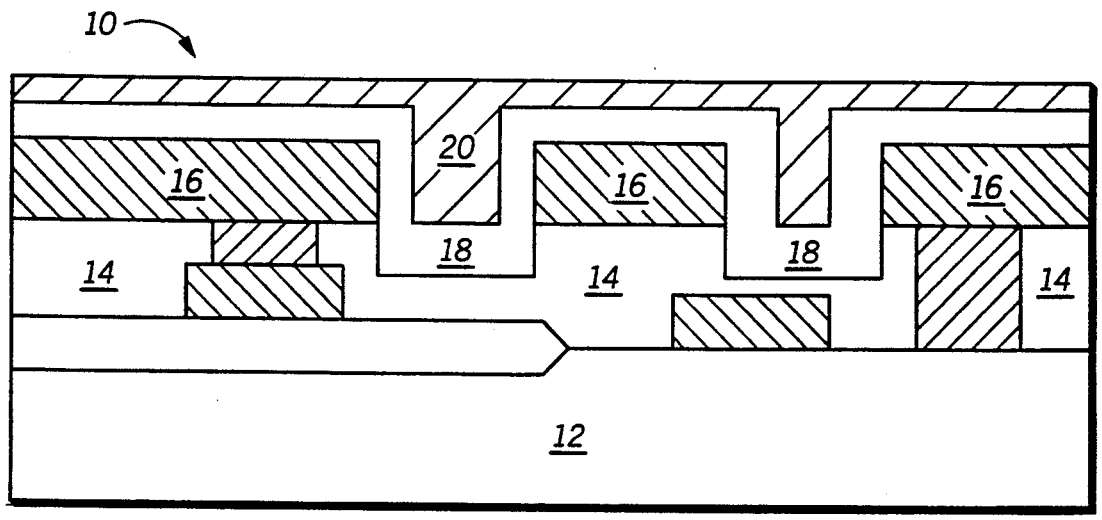

In FIG. 4, a second dielectric layer 18 is formed conformal to the underlying trenched portions of the dielectric layer 14, the conductive layer 16, and the sidewalls of the conductive layer 16. The formation of the dielectric layer 18 establishes recessed regions or pockets from the trenched portions that separate the electrically isolated conductive regions of conductive layer 16. Dielectric layer 18 is made of either nitride, tetra-ethyl-ortho-silicate (TEOS) based oxides, boro-phosphate-silicate-glass (BPSG), phosphate-silicate-glass (PSG), oxide-nitride-oxide (ONO), silicon dioxide ($SiO_2$), a like dielectric material, or a combination of dielectric materials.

A second conductive layer known as a shielding conductive layer 20 overlies the second dielectric layer 18 and lies at least partially within the recessed regions. In many cases, the conductive layer 20 will completely fill the recessed regions and therefore reduce topographical problems. Conductive layer 20 is made of polysilicon, metals, salicides, substrate material, epitaxial formations or the like. Conductive layer 20 is electrically connected to a fixed voltage supply, such as a power supply line (not illustrated) or a ground line (not illustrated). Conductive layer 20, by filling or covering the recessed regions and by being biased at a constant voltage, effectively reduces capacitive coupling between adjacent electrically isolated conductive regions of conductive layer 16. Due to the fact that capacitive coupling is reduced, the effects of cross-talk and RC time delays are also reduced. It is not unusual to have isolation between the electrically isolated conductive regions of conductive layer 16 increase by a factor of ten or more due to the presence of conductive layer 20 and the geometric structure of structure 10.

Figure 5:
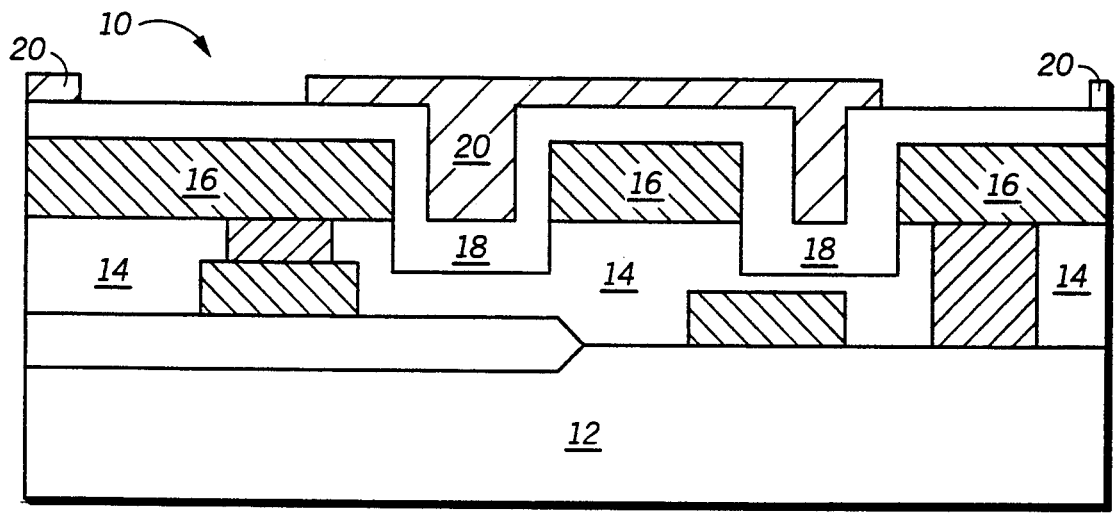

FIG. 5 illustrates an etch step that is used to pattern and remove portions of conductive layer 20. The etch step of FIG. 5 is necessary in order to connect subsequent conductive layers (not illustrated until FIG. 7) to conductive layer 16.

Figure 6:
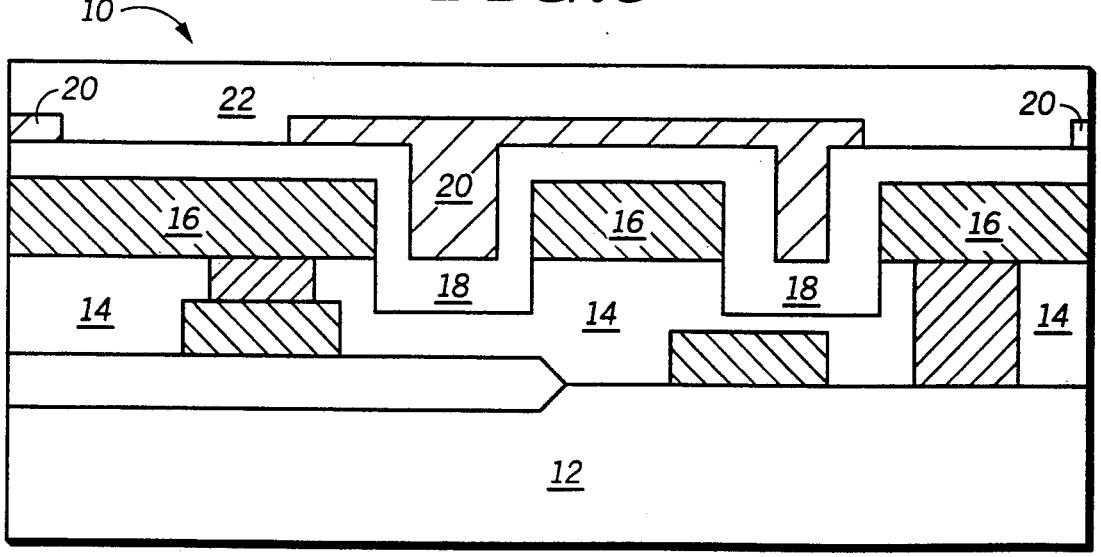
Figure 7:
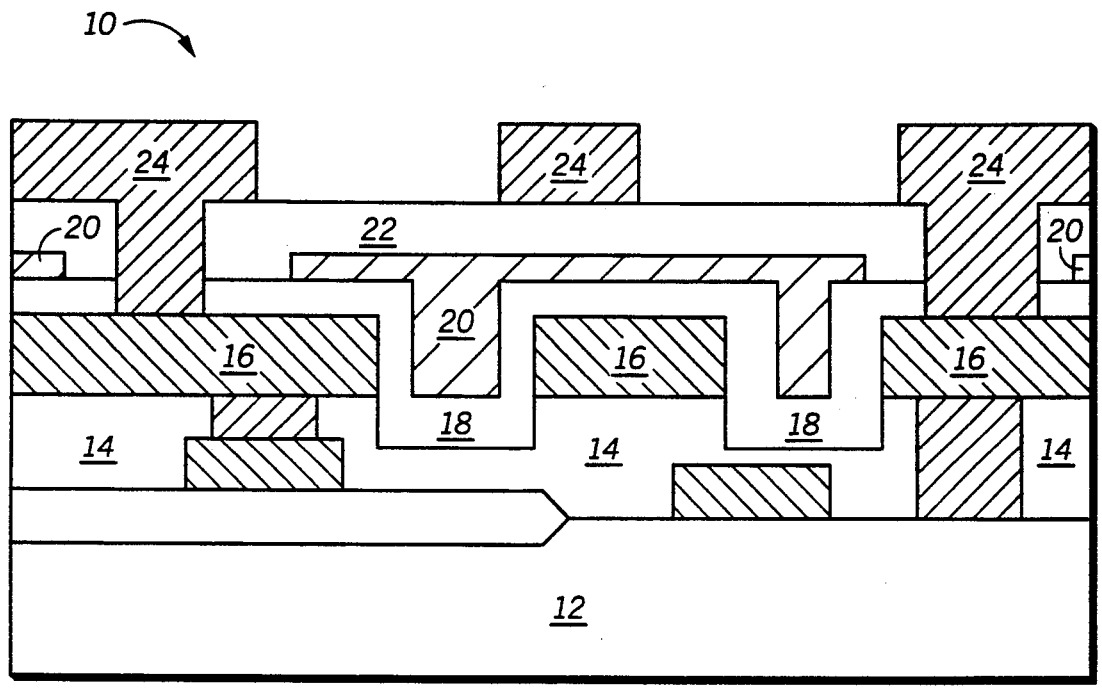

FIG. 6 illustrates a dielectric deposition or oxide deposition step which is used to form an inter-level dielectric layer 22. Dielectric layer 22 is preferably BPSG or a TEOS based dielectric, but can be made from one or more of the materials listed previously for dielectric layer 14. FIG. 7 illustrates an etch step. Portions of the dielectric layers 22 and 18 are removed to form via holes (illustrated but not labeled in FIG. 7) which expose conductive layer 16 or other conductive layers. A conductive layer 24 is formed, patterned and etched to form electrically isolated regions of conductive layer 24. Conductive layer 24 makes electrical contact to conductive layer 16 and other conductive layers via a via hole (not labeled) or contact (not labeled). The placement and use of vias or contacts are application dependent.

The shielding structure 10 is now complete. Electrically isolated regions of conductive layer 16 are shielding from one another by conductive layer 20. Conductive layer 20 does not hinder other conductive layers, such as conductive layer 24 from making electrical contact to underlying conductive layers. The conductive layer 20 has reduced capacitive coupling characteristics, reduced cross-talk, and reduced RC time delays between and within the electrically isolated conductive regions of conductive layer 16.

Figure 8:
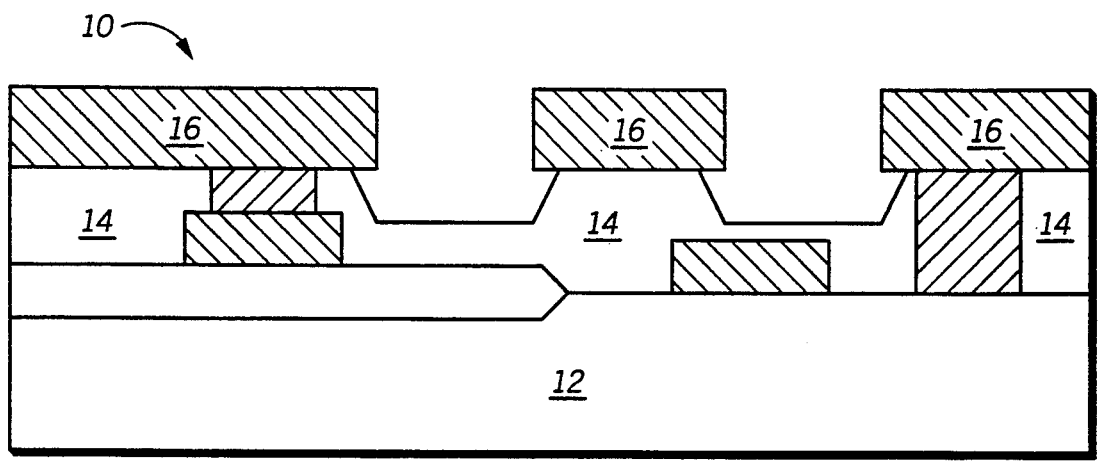
FIG. 8 illustrates, in cross-sectional form, an alternative step that may be used in the method of FIGS. 1-7 for forming the structure for shielding.

FIG. 8 illustrates an alternative step to the trench region formation step of FIG. 3. Instead of using an anisotropic etch, an isotropic etch can alternately be used to undercut portions of the dielectric layer 14 which underlies the conductive layer 16. This undercutting will allow the conductive layer 20 to be formed around a greater percentage of a cross-sectional perimeter of the electrically isolated conductive regions of conductive layer 16. This is due to the fact that the isotropic etch will encroach under the conductive layer 16 and expose a portion of a bottom surface of the conductive layer 16. The greater encapsulation of the conductive layer 16, due to the isotropic etch, may improve the isolation between adjacent electrically isolated conductive regions of conductive layer 16.

Figure 9:
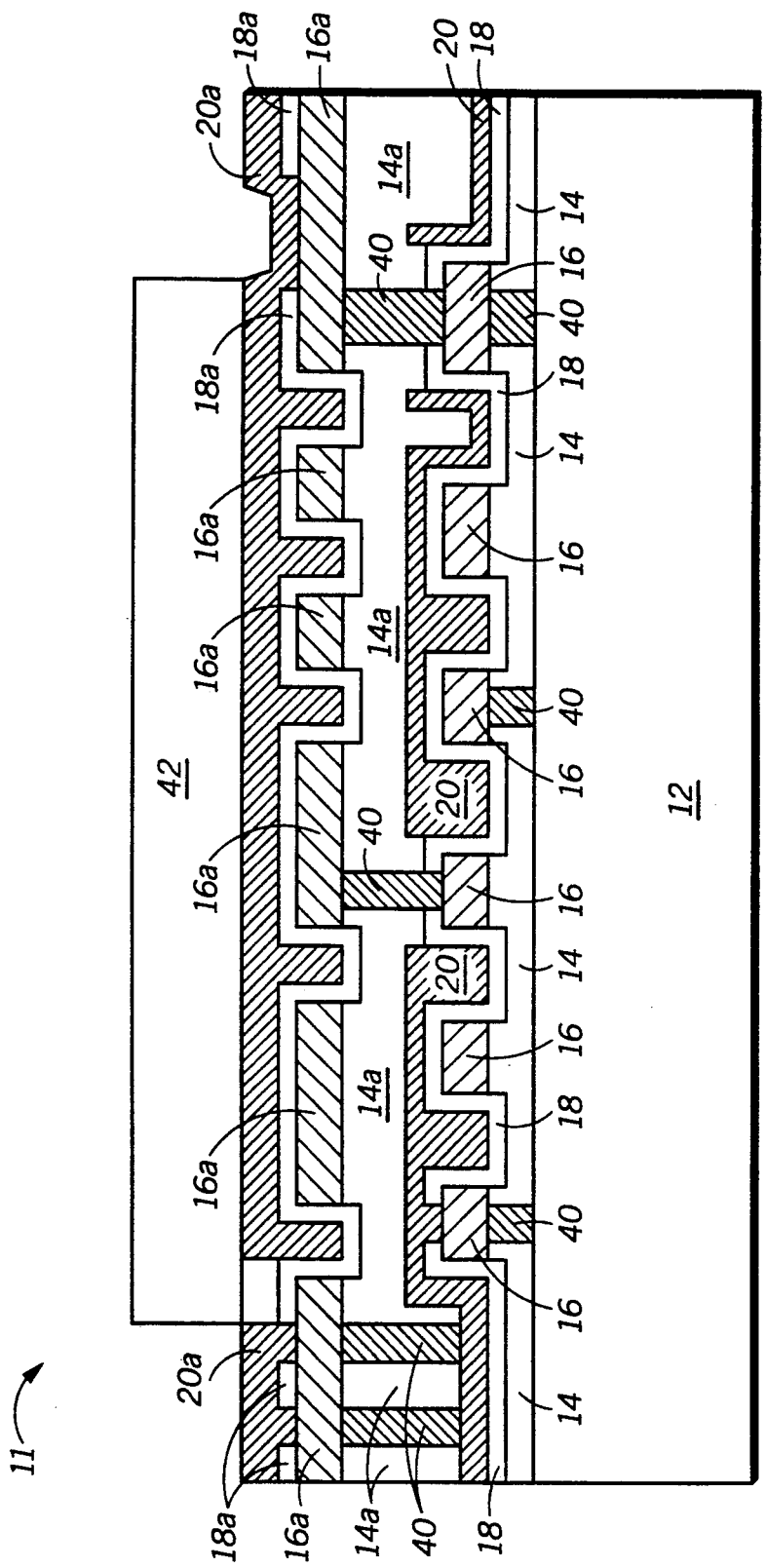
FIG. 9 illustrates, in cross-sectional form, an integrated circuit having structures for shielding formed in accordance with the present invention.

FIG. 9 illustrates a structure 11. Structure 11 has several occurrences of a shielded structure similar to structure 10 and formed by the process of FIGS. 1-7. Structure 11 is used to illustrate how structures 10 can be used in an advanced integrated circuit which requires two or more levels of active conductor layers. Regions and layers in FIG. 9 that are analogous to regions and layers in FIGS. 1-7 are identically labeled. The regions and layers of FIG. 9 that are analogous to regions and layers in FIGS. 1-7 may be modified and varied as described herein for the regions and layers of FIGS. 1-7.

FIG. 9 illustrates a first shielding structure which has a substrate 12, a first dielectric layer 14, a first conductive layer 16, a second dielectric layer 18, and a shielding conductive layer 20. The first shielding structure is formed by the process of FIGS. 1-7. The conductive layer 16 functions as the electrically isolated conductive regions, and conductive layer 20 shields the electrically isolated conductive regions from one another.

A second shielded structure is formed overlying the first shielding structure and has a substrate 12, a first dielectric layer 14a, a first conductive layer 16a, a second dielectric layer 18a, and a shielding conductive layer 20a. The second shielding structure is formed by the process of FIGS. 1-7. The conductive layer 16a functions as the electrically isolated conductive regions, and conductive layer 20a shields the electrically isolated conductive regions from one another.

Additional shielding structures can be stacked one on top of the other to insulate each conductive layer of active material. For example, the process of FIGS. 1-7 can be used to form five shielding structures in a process that required two active layers of polysilicon and three active layers of metal. Active layers are defined to be any layer that serves an electrical purpose for a circuit, such as gate electrodes, signal lines, power supply lines, bonding pads, contact lines, and the like.

Furthermore, a passivation layer 42 which is usually P-SiN$_x$ (Plasma Enhanced Silicon Nitride), PSG, BPSG, a TEOS based dielectric, a combination of the above dielectrics, or the like is formed overlying the first and second shielding structures. Passivation layer 42 protects the layers and regions of structure 11 and has openings that expose metal pad portions of the conductive layer 20a for metal wire ball bonding or the like. Individual via holes and contacts are illustrated in FIG. 9 as a contact/via 40. The purpose of a particular contact/via 40 is to allow an overlying conductive layer to electrically connect to an underlying conductive layer. This contact/via 40 connection is illustrated in FIG. 7 via the connection of conductive layer 24 and conductive layer 16.

Conductive layer 20 is electrically connected to a portion of conductive layer 20a that is not used for shielding but is connected to a ground potential (GND). A portion of the conductive layer 20a that is used for shielding is electrically connected to a power supply potential (Vcc or a voltage that usually is a fixed value that ranges from +2.5 V to 5.0 V although negative voltages and large voltages are possible for some power supply applications and requirements). The task of biasing shielding layers that shield other conductive layers is usually split in some predetermined manner between all the various power supplies and GNDs in the system. This is done to better balance capacitive coupling across various power supplies. This capacitive coupling balancing is not usually a limitation due to the fact that most integrated circuit applications require that an external capacitance be electrically connected to power supply and ground lines.

Large internal capacitance coupling resulting between power supply and signal lines and ground lines and signal lines can cause internal power supply and ground lines to become electrically unstable and spike or change in voltage occasionally. Signal lines are conductors, such as address buses and data buses, that are isolated via the ground or supply lines as described herein. This phenomenon, when related to ground lines, is known as ground bounce, and can severely alter the performance of analog circuitry such as A/D converters, filters, op-amps, transducers, and so on. Furthermore, severe "bouncing" of ground or power supply lines can cause logic gates or transistors to erroneously change logic state. Therefore, memory circuits, ASICs, microprocessors, and the like become erroneous and unstable. To avoid "bouncing" in power supply and ground lines, conventional decoupling circuitry or special processing is required.

In order to reduce coupling to the power supply and ground lines used for shielding and the power supply and ground lines used for logic and circuitry, separate ground lines and supply lines may be used. One set of power and ground lines is used for logic and circuits and one set of power and ground lines is used for shielding purposes. A more efficient method of isolation is to create two internal power supply lines and two internal ground lines respectively from one incoming power supply line and one incoming ground line. The isolation of one power or ground line from another power or ground line may require placing two inverters or a buffer in an electrical path of each of the shielding conductive layers. More advanced isolation, such as opto-isolators, op-amps, and the like, may be pursued if an application requires more involved and complete isolation. By isolating the shielding conductors from the power supply lines and ground lines that are used for logic and circuitry, ground bounce and like phenomena can be reduced.

In summary, the inventive process and structure 10 for shielding described herein has the ability to isolate IC conductive lines from one another with better isolation most conventional methods. Another added advantage is that the inventive process is less difficult than other known methods such as the coaxial cable approach. Furthermore, the inventive process is fully compatible and applicable to the most IC circuits currently being designed and manufactured. The shielding structure 10 provides isolation that reduces cross-talk effects and reduces unwanted RC time delays in conductive lines in a more efficient and complete manner than other known methods.

While the present invention has been illustrated and described with reference to specific embodiments, further modifications and improvements will occur to those skilled in the art. For example, the shielding method and structure described herein can be used to shield any geometry of a conductive formation made of any conductive material. Many biasing schemes exist for the shielding conductive layers. Many various etch techniques can be used to form the trenched portions of the first dielectric layer. The inventive method and structure can be combined with conventional technology, such as sidewall spacers formed on the sidewall of the electrically isolated conductive regions or salicide regions formed upon conductive layers, to improve structure performance or reduce geometry. It is to be understood, therefore, that this invention is not limited to the particular forms illustrated and that it is intended in the appended claims to cover all modifications that do not depart from the spirit and scope of this invention.

We claim:

1. A process for forming a structure for shielding, comprising the steps of:
   providing a substrate;
   forming a first dielectric layer overlying the substrate;
   forming a first conductive layer of material overlying the first dielectric layer;
   removing portions of the first conductive layer to form a first conductive region having a first conductive region sidewall and a second conductive region having a second conductive region sidewall, the removing also forming exposed regions of the first dielectric layer;

removing the exposed regions of the first dielectric layer to form trenched portions of the first dielectric layer;

forming a second dielectric layer overlying the electrically isolated conductive regions, the first conductive region sidewall, the first conductive region sidewall, and the trenched portions of the first dielectric layer to establish recessed regions from the trenched portions that separate the electrically isolated conductive regions; and forming a shielding conductive layer overlying the second dielectric layer including within the recessed regions, the shielding conductive layer being used to electrically isolate the first conductive region from the second conductive region.

2. The process of claim 1 wherein the step of removing portions of the first dielectric layer further comprises using an anisotropic etch to form the trenched portions of the first dielectric layer with nearly vertical sidewalls.

3. The process of claim 1 wherein the step of removing portions of the first dielectric layer further comprises using an isotropic etch to form the trenched portions of the first dielectric layer, the trenched portions being etched laterally outward to expose portions of a bottom surface of the first conductive layer.

4. The process of claim 1 wherein the steps of forming the first conductive layer and the shielding conductive layer further comprise forming each as a polysilicon layer.

5. The process of claim 1 wherein the steps of forming the first conductive layer and the shielding conductive layer further comprise forming each as a material which comprises a metal.

6. The process of claim 1 wherein the steps of forming the first conductive layer and the shielding conductive layer further comprise forming the first conductive layer of polysilicon and forming the shielding layer of a metal material.

7. A process for forming a shielded structure, comprising the steps of:

providing a silicon substrate;

depositing a first dielectric layer overlying the silicon substrate;

depositing a first metal layer of material overlying the first dielectric layer;

etching portions of the first metal layer to form electrically isolated metal regions having sidewalls, the removal also forming exposed regions of the first dielectric layer;

anisotropically etching the exposed regions of the first dielectric layer to form trenched portions of the first dielectric layer;

depositing a second dielectric layer conformally overlying the electrically isolated metal regions, the sidewalls of the electrically isolated metal regions, and the trenched portions of the first dielectric layer to establish recessed regions from the trenched portions, the recessed regions separating the electrically isolated metal regions; and depositing a shielding metal layer overlying the second dielectric layer including within the recessed regions, the shielding metal layer being coupled to a conductor for providing a fixed voltage supply which enhances electrical isolation of the electrically isolated metal regions.

8. The process of claim 7 wherein the step of depositing the first metal layer further comprises forming a portion of the first metal layer as a silicide material.

9. The process of claim 7 wherein the step of depositing the shielding metal layer further comprises forming at least a portion of the shielding metal layer from a silicide material.

10. In a semiconductor device, a method for electrically isolating a plurality of physically separated conductive regions, which are separated from each other by recessed regions comprising the steps of:

providing a substrate;

forming said plurality of physically separated conductive regions overlying the substrate, a selected one of said recessed regions being located between each conductive region in the plurality of physically separated conductive regions;

forming a dielectric isolation layer over the plurality of physically separated conductive regions and at least partially within the recessed regions; and forming a contiguous conductive shielding layer both overlying the dielectric isolation layer and within the recessed regions, the contiguous conductive shielding layer being used to reduce electrical coupling between adjacent physically separated conductive regions.

11. The method of claim 10 wherein the step of forming the contiguous conductive shielding layer comprises:

biasing the contiguous conductive shielding layer to a fixed supply voltage.

12. The method of claim 10 wherein the step of forming said plurality of physically separated conductive regions comprises forming the plurality of physically separated conductive regions as a material which comprises a metal.

13. A method for isolating at least two physically separated conductive regions, comprising the steps of:

providing a substrate material;

forming a plurality of transistors overlying the substrate material;

forming a dielectric layer overlying the plurality of transistors;

forming said conductive regions overlying the dielectric layer, the conductive regions having a first region which is physically separated from a second region;

defining recessed regions which separate each of the conductive regions;

forming an isolation layer both overlying the conductive regions and within the recessed regions;

forming a contiguous conductive layer overlying each of the conductive regions to reduce capacitive coupling between the first region and the second region when a substantially constant magnitude voltage is applied to said contiguous conductive layer.

* * * * *